US006570261B2

(12) United States Patent
Farquhar et al.

(10) Patent No.: US 6,570,261 B2
(45) Date of Patent: *May 27, 2003

(54) METHOD AND APPARATUS FOR INJECTION MOLDED FLIP CHIP ENCAPSULATION

(75) Inventors: Donald Seton Farquhar, Endicott, NY (US); Michael Joseph Klodowski, Endicott, NY (US); Konstantinos Papathomas, Endicott, NY (US); James Robert Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/118,395

(22) Filed: Apr. 8, 2002

(65) Prior Publication Data

US 2002/0111016 A1 Aug. 15, 2002

Related U.S. Application Data

(60) Continuation of application No. 09/228,601, filed on Jan. 12, 1999, now Pat. No. 6,369,449, which is a division of application No. 08/884,232, filed on Jun. 27, 1997, now Pat. No. 5,981,312.

(51) Int. Cl.[7] .............................................. H01L 23/48
(52) U.S. Cl. .................. 257/778; 257/787; 257/738
(58) Field of Search ............................... 257/687, 709, 257/737, 738, 778, 780

(56) References Cited

U.S. PATENT DOCUMENTS

| 4,143,456 A | 3/1979 | Inoue |
| 4,915,607 A | 4/1990 | Medders et al. |
| 5,019,673 A | 5/1991 | Juskey et al. |
| 5,120,678 A | 6/1992 | Moore et al. |
| 5,169,056 A | 12/1992 | Recle et al. |
| 5,203,076 A | 4/1993 | Banerji et al. |
| 5,218,234 A | 6/1993 | Thompson et al. |
| 5,239,198 A | 8/1993 | Lin et al. |
| 5,248,710 A | 9/1993 | Shiobara et al. |
| 5,273,938 A | 12/1993 | Lin et al. |
| 5,292,688 A | 3/1994 | Hsiao et al. |
| 5,302,850 A | * 4/1994 | Hara |
| 5,371,404 A | 12/1994 | Juskey et al. |
| 5,385,869 A | 1/1995 | Liu et al. |
| 5,420,752 A | * 5/1995 | Variot |
| 5,450,283 A | 9/1995 | Lin et al. |
| 5,623,006 A | 4/1997 | Papathomas |
| 5,663,106 A | * 9/1997 | Karavakis et al. |
| 6,369,449 B2 | * 4/2002 | Farquhar et al. ............ 257/778 |

FOREIGN PATENT DOCUMENTS

EP    0 690 499 A2    1/1996

OTHER PUBLICATIONS

IBM Technical Disclosure Bulletin vol. 36, No. 11, Nov. 1993 pp 59–60.
Patent abstracts of Japan Pub. No. 08153820 dated Jun. 11, 1996.
Patent abstracts of Japan Pub. No. 01191457 dated Aug. 1, 1989.
Patent abstracts of Japan Pub. No. 09120976 dated May 6, 1997.

* cited by examiner

Primary Examiner—David L. Talbott
Assistant Examiner—Lourdes Cruz
(74) Attorney, Agent, or Firm—William N. Hogg

(57) ABSTRACT

The electrical connections of an integrated circuit chip assembly comprised of an integrated circuit chip attached to a substrate are encapsulated and reinforced with a high viscosity encapsulant material by dispensing the encapsulant material through an opening in the substrate into the space between the integrated circuit chip and the substrate. An integrated circuit chin assembly having a reinforced electrical interconnection which is more resistant to weakening as a result of stress created by differences in coefficient of thermal expansion between the integrated circuit chip and the substrate to which the integrated circuit chip is attached is produced.

5 Claims, 4 Drawing Sheets

METHOD AND APPARATUS FOR INJECTION MOLDED FLIP CHIP ENCAPSULATION

CROSS REFERENCE TO RELATED APPLICATIONS

This application is a continuation of application Ser. No. 09/228,601, filed Jan. 12, 1999, now U.S. Pat. No. 6,369,449 B1, which is a division of Ser. No. 08/884,232 filed Jun. 27, 1997, U.S. Pat. No. 5,981,312.

BACKGROUND OF THE INVENTION

This invention relates to an improved method for encapsulating and reinforcing the electrical interconnections between an integrated circuit chip and a substrate. It also relates to an integrated circuit chip assembly produced by said method.

An integrated circuit chip assembly generally comprises an integrated circuit chip attached to a substrate, typically a chip carrier or a circuit board. The most commonly used integrated circuit chip is composed primarily of silicon having a coefficient of thermal expansion of about 2 to 4 ppm/° C. The chip carrier or circuit board is typically composed of either a ceramic material having a coefficient of thermal expansion of about 6 ppm/° C., or an organic material, possibly reinforced with organic or inorganic particles or fibers, having a coefficient of thermal expansion in the range of about 6 to 50 ppm/° C. One technique well known in the art for interconnecting integrated circuit chips and substrates is flip chip bonding. In flip chip bonding, a pattern of solder balls is formed on the active surface of the integrated circuit chip, allowing complete or partial population of the active surface with interconnection sites. The solder balls which typically have a diameter of about 0.002 to 0.006 inches, are deposited on solder wettable terminals on the active surface of the integrated circuit chip forming a pattern. A matching footprint of solder wettable terminals is provided on the substrate. The integrated circuit chip is placed in alignment with the substrate and the chip to substrate connections are formed by reflowing the solder balls. Flip chip bonding can be used to attach integrated circuit chips to chip carriers or directly to printed circuit boards.

During operation of an integrated circuit chip assembly, cyclic temperature excursions cause the substrate and the integrated circuit chip to expand and contract. Since the substrate and the integrated circuit chip have different coefficients of thermal expansion, they expand and contract at different rates causing the solder ball connections to weaken or even crack as a result of fatigue. To remedy this situation, it is common industry practice to reinforce the solder ball connections with a thermally curable polymer material known in the art as an underfill encapsulant. Underfill encapsulants are typically filled with ceramic particles to control their rheology in the uncured state and to improve their thermal and mechanical properties in the cured state.

Underfill encapsulants have been widely used to improve the fatigue life of integrated circuit chip assemblies consisting of an integrated circuit chip of the flip chip variety attached to a substrate made of alumina ceramic material having a coefficient of thermal expansion of about 6 ppm/° C. More recently, integrated circuit assemblies having an integrated circuit chip of the flip chip type attached to a substrate made of a reinforced organic material with a composite coefficient of thermal expansion of about 20 ppm/° C. have been manufactured.

At the first level of packaging, the underfill encapsulation process is typically accomplished by dispensing the liquid encapsulant at one or more points along the periphery of the integrated circuit chip. The encapsulant is drawn into the gap between the integrated circuit chip and the substrate by capillary forces, substantially filling the gap and forming a fillet around the perimeter of the integrated circuit chip. The diameter of the filler particles in the encapsulant are sized to be smaller than the height of the gap so as not to restrict flow. Typical encapsulant formulations have a viscosity of about 10 Pa-s at the dispense temperature. After the encapsulant has flowed into the gap, it is cured in an oven at an elevated temperature.

Cured encapsulants typically have coefficients of thermal expansion in the range of about 20 to 40 ppm/° C., and a Young's Modulus of about 1 to 3 GPa, depending on the filler content and the polymer chemistry. It may be desirable in some cases to further alter the cured properties of the encapsulant, however, the requirement that the encapsulant have low viscosity in the uncured state severely restricts the formulation options. For example, the addition of more ceramic filler would lower the resulting coefficient of thermal expansion, but increase the uncured viscosity.

At the second level of packaging, encapsulating materials can be used to reinforce the interconnections between a circuit board and an integrated circuit chip assembly comprised of an integrated circuit chip attached to a chip carrier. In this type of assembly the solder balls typically have a diameter in the range of about 0.020 to 0.030 inches. Several methodologies are known for reinforcing and encapsulating this type of interconnection. However, the various methods used for reinforcing and encapsulating interconnections at the second level are not extendable to first level packaging because of the differences in flow regimes resulting from the different gap heights. In the case of a flip chip package with a gap of 0.002 to 0.006 inches, the flow characteristics of the underfill encapsulant are governed by viscous forces and capillary forces; viscous forces resisting flow and capillary forces driving flow. Suitable materials for first level underfill encapsulation are highly engineered to exhibit tightly controlled viscosity levels and specific wetting characteristics. In the case of a second level encapsulation, where the gap is about 0.020 to 0.030 inches in height, conventional first level underfill encapsulants would flow indiscriminately across the surface of the printed circuit board unless some external barrier prevents such flow.

Known in the art is a method for encapsulation of a flip chip package wherein a package body is formed around the perimeter of the flip chip in a two step process. First the integrated circuit chip is underfilled as previously described for first level packaging, and then a package body is formed around the perimeter of the integrated circuit chip using a molding process. In yet another known method, additional reinforcement is achieved by encapsulating both faces of the flip chip and its perimeter in a single step. In this technique, the gap between the integrated circuit chip and the substrate has been substantially eliminated by forming a large hole in the substrate that comprises at least 50% of the active area of the integrated circuit chip. This approach essentially eliminates the small gap typical of a conventional integrated circuit chip to substrate interconnection, but has the drawback of limiting the active area of the integrated circuit chip that can be used for forming interconnections because only the perimeter of the integrated circuit chip can be used.

Notwithstanding the use of underfill encapsulation, fatigue life of an integrated circuit chip assembly is shorter when the solder interconnections are made to organic substrates as opposed to ceramic substrates, owing to the greater mismatch in thermal expansion. Together with the limitations imposed on formulation options by the low viscosity requirement, improvement in the mechanical reinforcement of integrated circuit chip interconnections is still required.

It is the object of the present invention to provide an improved method for underfilling and for encapsulating flip chip packages. It is also the object of this invention to permit the use of more viscous materials as underfill materials. It is the further object to provide a method which permits increased speed for the encapsulation process and allows the encapsulation process, both underfilling and overmolding, to be completed in a single step using a single encapsulant material.

SUMMARY OF THE INVENTION

This invention provides an improved method for encapsulating the solder ball interconnections of an integrated circuit chip assembly which accommodates the use of high viscosity encapsulating materials and eliminates the need for a dam to contain flow. In accordance with the preferred embodiment of this invention, an integrated circuit chip assembly comprised of an integrated circuit chip mounted on a chip carrier or directly on a circuit board in a standoff relationship is provided. The chip carrier or circuit board is constructed with an opening which extends from the surface on which the integrated circuit chip is mounted to the opposite surface of the chip carrier or circuit board. The integrated circuit chip is mounted on the chip carrier or circuit board above the opening.

External pressure is applied to the exposed surface of the integrated circuit chip and a metered volume of encapsulant material is dispensed through the opening into the space between the integrated circuit chip and the chip carrier or circuit board. The preferred encapsulant material comprises a high strength thermosetting two part epoxy containing about 50% by weight of a ceramic filler and has a viscosity at 25° C. of about 250 Pascal-seconds measured using a Brookfield viscometer, model HET, with a CP-52 cone head, at 2 rpm; although materials having viscosities in the range of about 10 to 1,000 Pascal-seconds may also be used. In one aspect of this invention the volume of encapsulating material is equivalent to the amount required to fill the space between the integrated circuit chip and the chip carrier or circuit board. In another aspect of this invention the volume of encapsulating material is equivalent to the amount necessary to (1) fill the space between the integrated circuit chip and the chip carrier, and substantially cover a portion of the surface of the chip carrier; or (2) fill the space between the integrated circuit chip and the circuit board, and substantially cover a predetermined surface area of the circuit board. After the required amount of encapsulant material is dispensed, the encapsulant material is cured to form a bond between the integrated circuit chip and the chip carrier or circuit board and reinforce the standoff connections.

In yet another embodiment of this invention, a mold is placed over the integrated chip, surrounding but not in contact with the integrated circuit chip. An amount of encapsulant necessary to completely encapsulate the integrated circuit chip as well as the electrical interconnections between the integrated circuit chip and the substrate is dispensed through the opening in the substrate. The encapsulant material is then cured to form a bond between the integrated circuit chip and the chip carrier or circuit board and reinforce the standoff connections.

DETAILED DESCRIPTION

Figure 1:
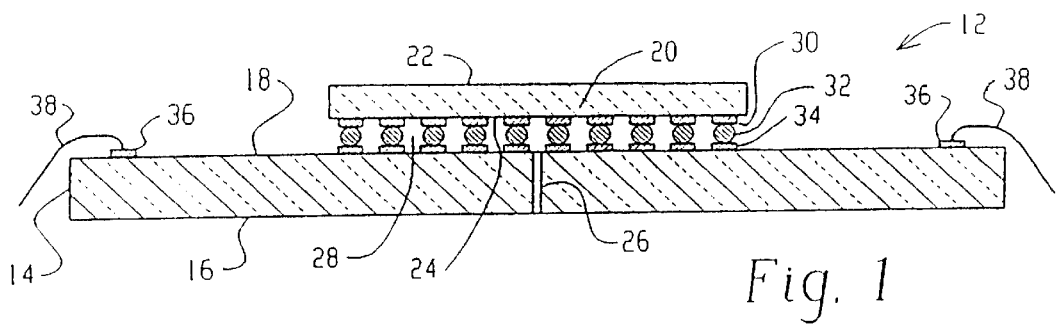
FIG. 1 is a longitudinal sectional view somewhat diagrammatic of an integrated circuit chip mounted on a chip carrier ready to receive an encapsulant according to one embodiment of this invention.

Referring to FIG. 1, an integrated circuit chip assembly, indicated generally at 12, is comprised of a chip carrier 14, having a remote surface 16 and a mounting surface 18, and an integrated circuit chip 20, having a remote surface 22 and an attachment surface 24. The chip carrier 14 has an opening 26 extending from the remote surface 16 to the mounting surface 18. The integrated circuit chip 20 is mounted on the chip carrier 14 above the opening 26 in a standoff relationship with the attachment surface 24 of the integrated circuit chip 20 facing the mounting surface 18 of the chip carrier 14, creating a space 28 between the attachment surface 24 of integrated circuit chip 20 and the mounting surface 18 of the chip carrier 14. In a typical integrated circuit chip assembly, the height of the space 28 is about 0.002 to 0.006 inches. The attachment surface 24 of the integrated circuit chip 20 has arranged thereon, a plurality of electrical contacts 30. Each electrical contact 30 has a solder ball 32 attached thereto. The mounting surface 18 of the chip carrier 14 has arranged thereon, a plurality of electrical contacts 34, each of said electrical contacts 34 arranged to correspond to a solder ball 32 on the attachment surface 24 of the integrated circuit chip 20.

The chip carrier 14 in one embodiment is comprised of a ceramic material, typically alumina having a coefficient of thermal expansion of about 6 ppm/° C. The chip carrier can also be comprised of organic materials such as PTFE, polyimides, polytetrafluoroethylene, epoxies, triazines, bismaleimides, bismaleimides/triazines, and blends of these materials. These materials may be reinforced either by woven or non-woven inorganic or organic media such as glass, fibers or particles. Such materials typically have coefficients of thermal expansion ranging from about 6 to 50 ppm/° C. The chip carrier has arranged about its perimeter, a plurality of electrical contacts 36. Each electrical contact 36 has attached thereto a wire lead 38 for interconnection between the chip carrier 14 and a substrate, typically a circuit board, to which the integrated circuit chip assembly is to be attached. The chip carrier 14 may also be of the ball grid array type herein rather than having edge leads 38, solder balls having a diameter of about 0.020 to 0.030 inches are attached to the attachment surface 18 or the remote surface 16 of the chip carrier 14. The integrated circuit chip 20 is typically comprised of monocrystalline silicon having a coefficient of thermal expansion of about 2 to 4 ppm/° C. Each solder ball 32 is typically comprised of an electrically conductive metallic solder material. The integrated circuit chip 20 is attached to the chip carrier 14 by solder reflow. During operation, the chip carrier 14 and the integrated circuit chip 20 are subjected to repeated cycles of heating and cooling. Because the chip carrier 14 and the integrated circuit chip 20 have different coefficients of thermal expansion, they expand and contract at different rates. This results in thermal stress on the connections between the solder balls 32 and the electrical contacts 30 and 34 sometimes causing the interconnection between the chip carrier 14 and the integrated circuit chip 20 to weaken or even fracture.

Figure 2:
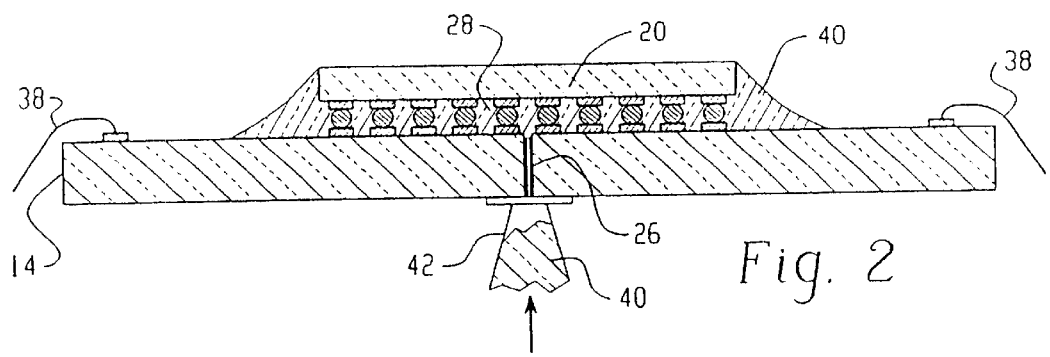
FIG. 2 is a longitudinal sectional view somewhat diagrammatic of an integrated circuit chip mounted on a chip carrier with encapsulant dispensed into the space between the integrated circuit chip and the chip carrier according to one embodiment of this invention.

Referring to FIG. 2, in accordance with one embodiment of this invention, an amount of the encapsulant 40 necessary to substantially fill the space 28 without substantial overflow onto the mounting surface 18 of the chip carrier 14 is dispensed through the opening 26 into the space 28. In a preferred embodiment, the encapsulant 40 comprises Hysol FP-4323, a high strength thermosetting one part epoxy containing about 50%–70% by weight of a ceramic filler and has a viscosity at 25° C. of about 250 Pascal-seconds measured using a Brookfield viscometer, model HBT, with a CP-52 cone head, at 2 rpm, although encapsulants having viscosities in the range of about 10 to 1,000 Pascal-seconds can be used. The encapsulant 40 is dispensed through the opening 26 into the space 28 using a dispensing apparatus indicated generally at 42. In the preferred embodiment, using an encapsulant 40 having a viscosity of about 250 Pascal-seconds at 25° C., the dispensing apparatus 42 comprises an injection apparatus with a 0.020 inch diameter needle. A pressure of approximately 80 psi is required to inject the encapsulant 40 into the space 28. In the preferred embodiment, the viscosity of the encapsulant 40 is such that encapsulant 40 does not flow readily into space 28 without some drawing force. Thus, the encapsulant 40 must be forced through the opening 26 and into the space 28 using the dispensing apparatus 42. Because the encapsulant 40 is highly viscous and the amount of the encapsulant 40 dispensed into the space 28 is limited to the volume of the space 28, the surface tension between the encapsulant 40 and the chip carrier 14 and the integrated circuit chip 20 cause the encapsulant to be self-containing and there is no substantial flow of the encapsulant 40 outside of the space 28. Thus the necessity of a dam to contain flow of the encapsulant 40 is eliminated. The encapsulant 40 is then heated for about 2 hours at 160° C. to cure the encapsulant 40 and form a bond between the integrated circuit chip 20 and the chip carrier 14 and reinforce the solder ball connections.

Figure 3:
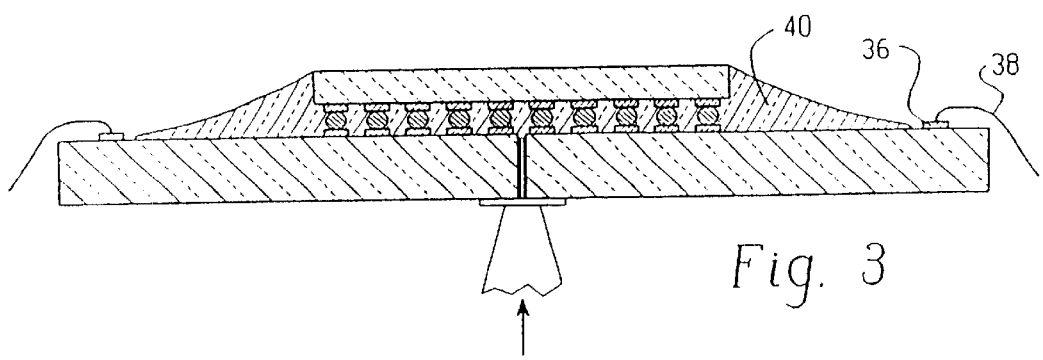
FIG. 3 is a longitudinal sectional view somewhat diagrammatic of an integrated circuit chip mounted on a chip carrier with encapsulant dispensed into the space between the integrated circuit chip and the chip carrier according to another embodiment of this invention.
Figure 5:
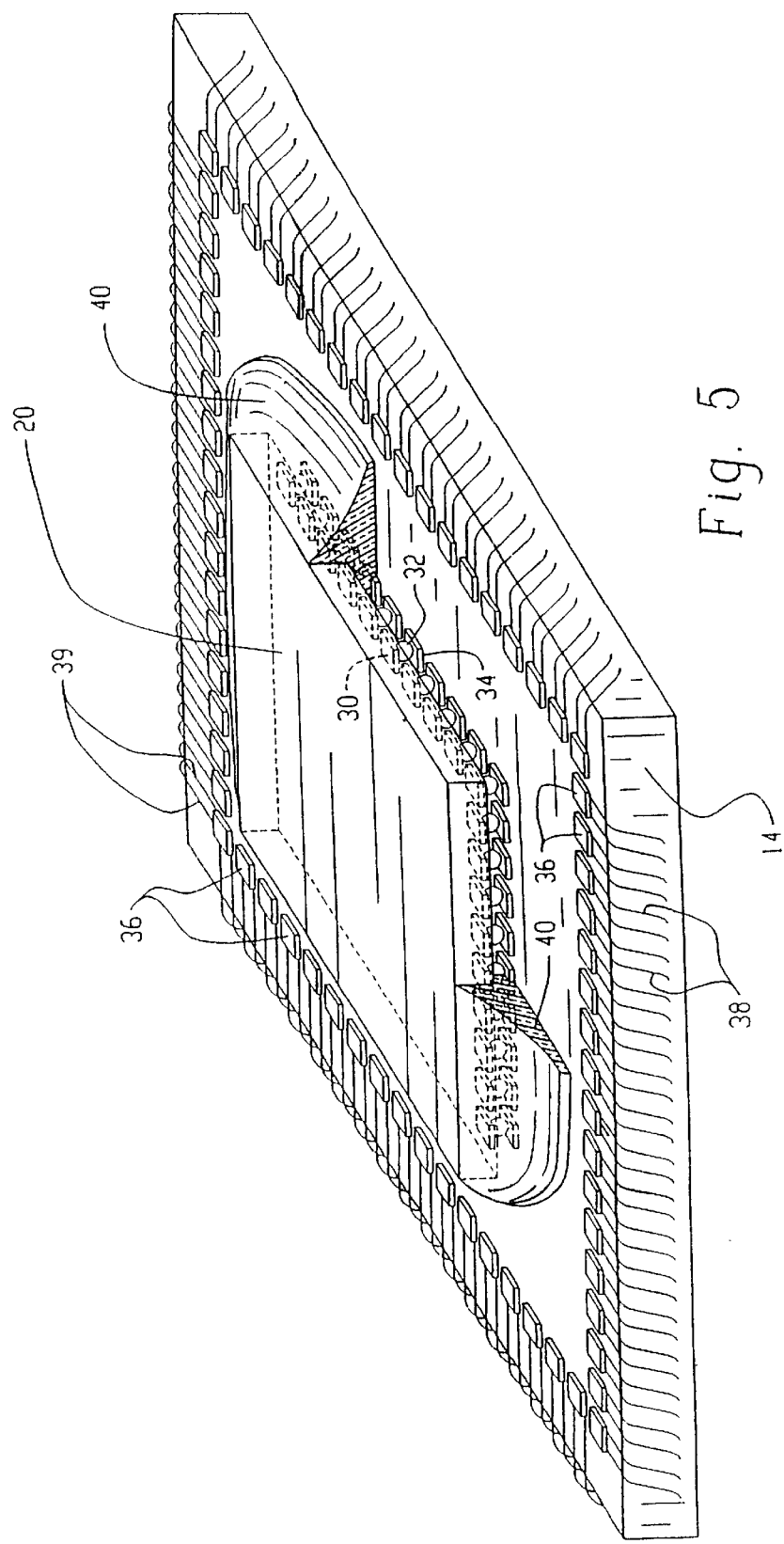
FIG. 5 is a perspective view somewhat diagrammatic of an encapsulant reinforced integrated circuit chip assembly produced according to one embodiment of this invention.
Figure 6:
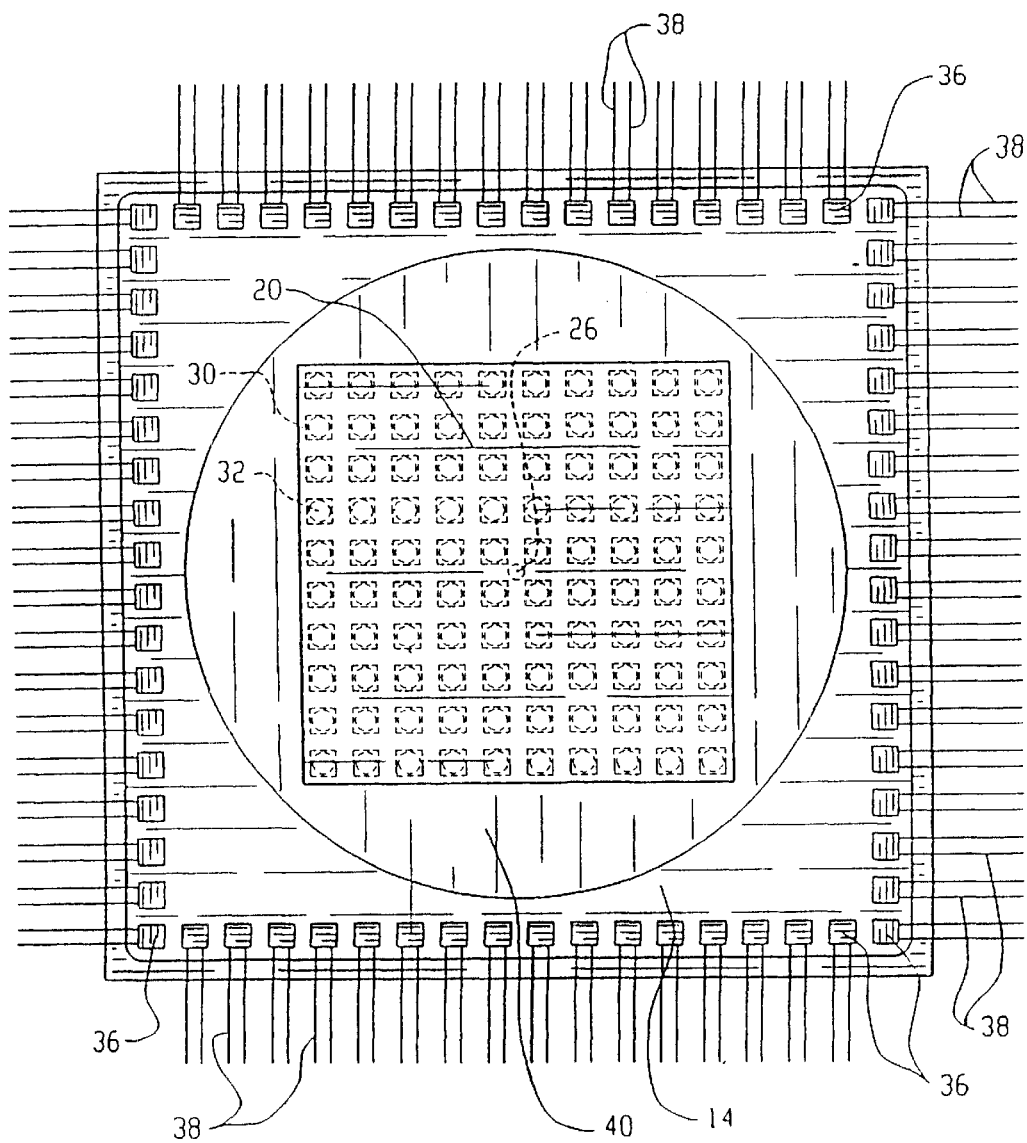
FIG. 6 is an overhead view somewhat diagrammatic of an encapsulant reinforced integrated circuit chip assembly produced according to one embodiment of this invention.

In another embodiment of this invention, referring to FIGS. 3, 5, and 6, in which the several elements are similar to like elements of FIGS. 1 and 2, the amount of the encapsulant 40 dispensed through the opening 26 is equal to the amount necessary to substantially fill the space 28 and also cover a portion of the mounting surface 18 of the chip carrier 14. The encapsulant 40 is forced into the space 28 and outward onto the mounting surface 18 of the chip carrier 14. As in the previously described embodiment, the encapsulant 40 is highly viscous and surface tension between the encapsulant and the mounting surface 18 hinders flow of the encapsulant 40 beyond the point to which the encapsulant 40 is forced by means of the dispensing apparatus 42. The encapsulant 40 is then heated for about 2 hours at 160° C. to cure the encapsulant 40 and form a bond between the chip carrier 14 and the integrated circuit chip 20 and reinforce the solder ball connections.

Figure 4:
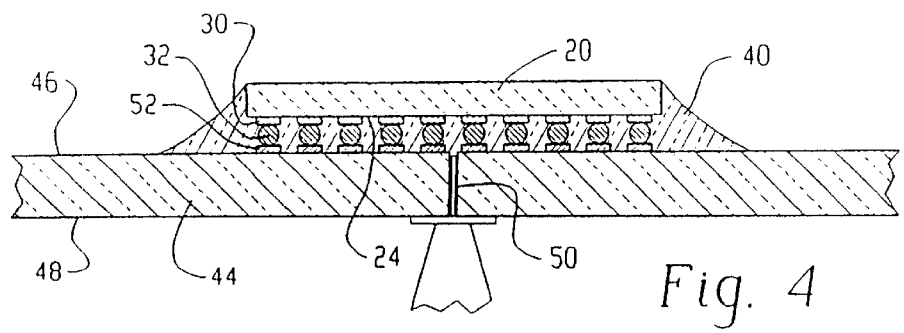
FIG. 4 is a longitudinal sectional view somewhat diagrammatic of an integrated circuit chip mounted on a circuit board ready to receive an encapsulant according to yet another embodiment of this invention.

In an alternate embodiment of this invention, referring to FIG. 4, the integrated circuit chip 20 is mounted directly onto a circuit board 44, rather than to a carrier which in turn is mounted to a circuit board. The circuit board 44 has a mounting surface 46 and a remote surface 48. Similar to the first-described embodiment the circuit board 44 has an opening 50 extending from the remote surface 48 of the circuit board 44 to the mounting surface 46 of the circuit board 44. The integrated circuit chip 20 is mounted directly onto the circuit board 44 above the opening 50 in a standoff relationship with the attachment surface 24 of the integrated circuit chip 20 facing the mounting surface 46 of the circuit board creating a space therebetween. As in the first-described embodiment, the integrated circuit chip 20 has arranged on its attachment surface 24, a plurality of electrical contacts 30. Each electrical contact 30 has attached thereto a solder ball 32. The mounting surface 46 of the circuit board 44 has a plurality of electrical contacts 52 arranged thereon. Each electrical contact 52 is arranged to correspond to a solder ball 32 on the attachment surface 24 of the integrated circuit chip 20. An amount of the encapsulant 40 necessary to substantially fill the space between the attachment surface 24 of the integrated circuit chip 20 and the mounting surface 46 of the circuit board 44; or to substantially fill the space between the attachment surface 24 of the integrated circuit chip. 20 and the mounting surface 46 of the circuit board 44, and substantially cover a predetermined surface area of the mounting surface 46 of the circuit board 44, is dispensed through the opening 50 and into the space between the attachment surface 24 of the integrated circuit chip 20 and the mounting surface 46 of the circuit board 44. The encapsulant 40 is then cured to form a bond between the integrated circuit chip 20 and the circuit board 44 and reinforce the solder ball connections.

Figure 7:
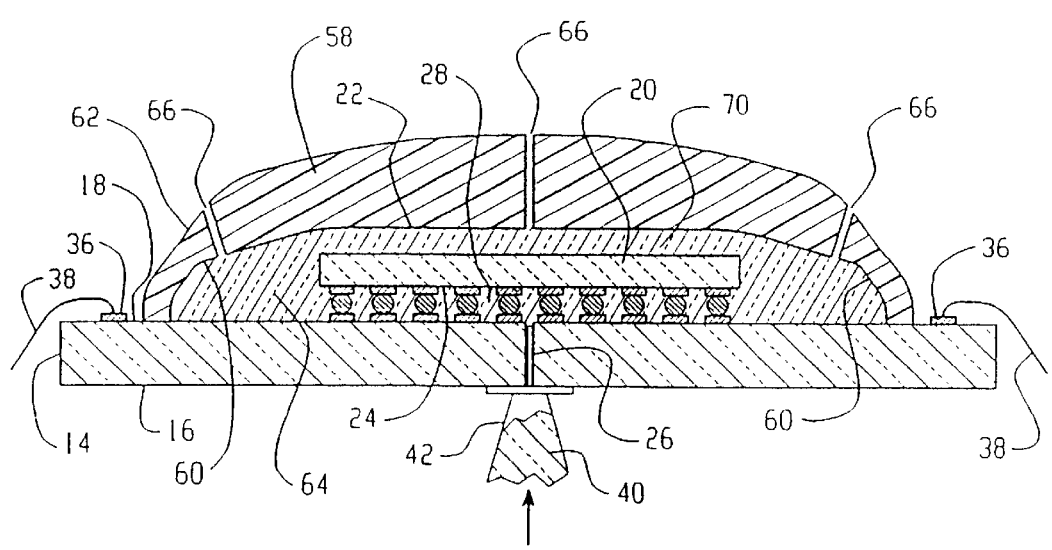
FIG. 7 is a longitudinal sectional view somewhat diagrammatic of an integrated circuit chip mounted on a chip carrier and covered with a mold with encapsulant dispensed into the space between the integrated circuit chip and the chip carrier and encapsulating the integrated circuit chip and the electrical interconnections between the integrated circuit chip and the chip carrier according to another embodiment of this invention.

In yet another embodiment of this invention, referring to FIG. 7, in which the several elements are similar to like elements of FIG. 1, a mold 58 having at least one vent 66 extending from an inside surface 60 to an outside surface 62, is placed over the integrated circuit chip 20 so that there is a space 70 between the inside surface 60 of the mold 58 and the remote surface 22 of the integrated circuit chip 20, and a void 64 surrounding the integrated circuit chip 20. The mold 58 can be made of metal or plastic, and can be reusable or disposable. External pressure is applied to the outside surface 62 of the mold 58 to seal the mold 58 to the mounting surface 18 of the chip carrier 14. An amount of encapsulant 40 necessary to substantially fill the space 70, the void 64 and the space 28 is dispensed through the opening 26 thus encasing the integrated circuit chip 20. The encapsulant 40 is then heated for about 2 hours at 160° C. to cure the encapsulant 40 and form a bond between the integrated circuit chip 20 and the chip carrier 14 and reinforce the solder ball connections. The mold 58 may be removed prior to or after curing. This method may also be used to reinforce the electrical interconnections between an integrated circuit chip and a circuit board.

Accordingly, the preferred embodiment of the present invention has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

What is claimed is:

1. An integrated circuit chip assembly, comprising:
   an integrated circuit chip having an attachment surface and a remote surface,
   a plurality of conductive contacts arranged on said attachment surface, each of said conductive contacts having a standoff connection attached thereto;
   a substrate having a mounting surface and a remote surface, and an opening extending from said mounting surface to said remote surface;
   a plurality of electrical contacts arranged on said mounting surface, each of said electrical contacts attached to one of said standoff connections defining a space between said attachment surface and said mounting surface;
   an encapsulant disposed between said mounting surface and said attachment surface, completely encapsulating said integrated circuit chip, said standoff connections, said electrical contacts, and said conductive contacts, and substantially filling said space.

2. The integrated circuit chip assembly of claim 1 wherein said encapsulant comprises a high strength thermosetting polymer having a viscosity in the range of 10 to 1,000 Pascal-seconds at dispense temperature.

3. The integrated circuit chip assembly of claim 2 wherein said standoff connections comprise solder balls.

4. The integrated circuit chip assembly of claim 3 wherein said substrate comprises a chip carrier.

5. The integrated circuit chip assembly of claim 3 wherein said substrate comprises a circuit board.

* * * * *